US009897248B2

United States Patent
Chen et al.

(10) Patent No.: US 9,897,248 B2
(45) Date of Patent: Feb. 20, 2018

(54) DISPLAY DEVICE

(71) Applicants: Qisda (Suzhou) Co., Ltd., Suzhou, Jiangsu (CN); Qisda Corporation, Taoyuan (TW)

(72) Inventors: Chun-Ting Chen, Taoyuan (TW); Yen-Chen Chiang, Taoyuan (TW)

(73) Assignees: Qisda (Suzhou) Co., Ltd., Suzhou (CN); Qisda Corporation, Taoyuan (TW)

(*) Notice: Subject to any disclaimer, the term of this patent is extended or adjusted under 35 U.S.C. 154(b) by 0 days.

(21) Appl. No.: 15/242,590

(22) Filed: Aug. 21, 2016

(65) Prior Publication Data

US 2017/0064846 A1 Mar. 2, 2017

(30) Foreign Application Priority Data

Aug. 28, 2015 (TW) .............................. 104128474 A

(51) Int. Cl.
*G06F 1/16* (2006.01)
*F16M 11/10* (2006.01)
*H05K 1/14* (2006.01)
*F16M 11/28* (2006.01)

(52) U.S. Cl.
CPC ............. *F16M 11/10* (2013.01); *F16M 11/28* (2013.01); *G06F 1/166* (2013.01); *H05K 1/148* (2013.01); *H05K 2201/10128* (2013.01)

(58) Field of Classification Search
CPC ....... G06F 1/166; G06F 1/1601; F16M 11/10; F16M 11/28

USPC ............ 248/917–920, 924, 157; 361/679.21, 361/679.22, 679.59
See application file for complete search history.

(56) References Cited

U.S. PATENT DOCUMENTS

| | | | | |
|---|---|---|---|---|
| 6,229,584 B1* | 5/2001 | Chuo | ..................... | G06F 1/1601 248/917 |
| 6,268,997 B1* | 7/2001 | Hong | ..................... | F16M 11/10 248/398 |
| 8,074,948 B2* | 12/2011 | Zou | ...................... | F16M 11/046 248/123.11 |
| 2003/0075649 A1* | 4/2003 | Jeong | ................... | F16M 11/105 248/157 |
| 2003/0234332 A1* | 12/2003 | Yen | ........................ | F16M 11/28 248/404 |
| 2004/0250635 A1* | 12/2004 | Sweere | .................. | F16M 11/10 74/1 R |

* cited by examiner

*Primary Examiner* — Nidhi Thaker

(57) ABSTRACT

A display device includes a display, a base, a flexible circuitry connecting the display to the base, and a support frame assembly disposed between the display and the base. The support frame assembly includes an inner rail connecting to the base, an outer rail connecting to the display, and a first stop member. The outer rail is movably connected to the inner rail so that the outer rail is disposed at a first position or a second position relative to the base. An accommodation space is formed between the outer rail and the inner rail for accommodating the flexible circuitry. The first stop member is disposed between the inner rail and outer rail and extends from the inner rail and away from the accommodation space for restricting the outer rail to move along the inner rail between the first position and the second position.

10 Claims, 6 Drawing Sheets

DISPLAY DEVICE

FIELD OF THE INVENTION

The present invention relates to a display device, and more particularly to a display device having a telescopic support frame assembly.

BACKGROUND OF THE INVENTION

Flat display devices have been extensively applied in a variety of technical fields. They may be used as televisions or for other display purposes, or may be incorporated into electronic devices for displaying information. Presently, those with liquid crystal display panels are the most common flat display devices among the various types of existing displays devices.

Typically, a support frame may be disposed at the rear cover of a flat display device. The support frame can be secured onto the rear cover to allow a user to place the display device on a surface and adjust the angle between the support frame and the backboard so that the display device is maintained at a slightly tilted position. Additionally, a rail assembly with limiting stoppers may be formed in the support frame to allow the user to adjust the length of the support frame for optimal viewing heights.

In order to produce thinner flat display devices, boards of signal control and power supply in a flat display device are often moved to the base of the support frame with electrical routings connecting with the display disposed within the support frame. However, such configuration would limit the accommodation space within the support frame and leave no space for disposing limiting stoppers. As a result, length of the support frames for such flat display devices is typically non-adjustable, thus limiting the functions of the support frames.

Consequently, improving the aforementioned technical issue has been among the main focuses in the art.

BRIEF SUMMARY OF THE INVENTION

An objective of the present invention is to provide a display device with an adjustable support frame assembly capable of accommodating a flexible circuitry that electrically connects to the base and the display.

To achieve the aforementioned advantages, the present invention provides a display device, including a display, a base, and a support frame assembly. A flexible circuitry connects the display to the base, and the support frame assembly is disposed between the display and the base. The support frame assembly includes an inner rail, an outer rail, and a first stop member. The inner rail is connected to the base. The outer rail is connected to the display, and is movably connected to the inner rail so that the outer rail is disposed at a first position or a second position relative to the base. An accommodation space is formed between the outer rail and the inner rail for accommodating the flexible circuitry. The first stop member is disposed between the inner rail and the outer rail and extends from the inner rail toward a direction away from the accommodation space for restricting the outer rail to move along the inner rail between the first position and the second position.

In an embodiment of the present invention, the inner rail includes a first sidewall, a second sidewall opposite to the first sidewall, and a first wall disposed between the first sidewall and the second sidewall. The outer rail includes a third sidewall, a fourth sidewall opposite to the third sidewall, and a second wall disposed between the third sidewall and the fourth sidewall. The first sidewall is opposite to the third sidewall, the second sidewall is opposite to the fourth sidewall, the first wall is opposite to the second wall, and the accommodation space is formed by the first sidewall, the second sidewall, the first wall and the second wall.

In an embodiment of the present invention, the first stop member includes a first protrusion extending from the first sidewall toward the third sidewall and a second protrusion extending from the second sidewall toward the fourth sidewall.

In an embodiment of the present invention, the outer rail further includes a second stop member disposed between the third sidewall and the fourth sidewall and extending from a bottom of the second wall toward the first wall.

In an embodiment of the present invention, the support frame assembly further includes a slide assembly disposed at the outer rail and between the first stop member and the second stop member, for enabling the outer rail to move along the inner rail. The slide assembly includes a first slide member and a second slide member. The first slide member is disposed between the first sidewall and the third sidewall, and the second slide member is disposed between the second sidewall and the fourth sidewall.

In an embodiment of the present invention, the slide assembly abuts against the first stop member when the outer rail is disposed at the second position.

In an embodiment of the present invention, the flexible circuitry includes a first portion and a second portion. The first portion is partially attached to the second wall of the outer rail, and the second portion is flexible.

In an embodiment of the present invention, the flexible circuitry partially exposes out of the accommodation space and connects to the base and the display.

In an embodiment of the present invention, the inner rail is detachably connected to the base.

In an embodiment of the present invention, the outer rail is detachably connected to the display.

In an embodiment of the present invention, the support frame assembly further includes a housing covering the inner rail and the outer rail and disposed at the base. At least a portion of the outer rail is exposed out of the housing when the outer rail is disposed at a position higher than the first position.

In an embodiment of the present invention, the display includes a connecting circuit board, the base includes a control circuit board, and the flexible circuitry is detachably and electrically connected to the connecting circuit board and the control circuit board.

The support frame assembly of the display device according to the embodiments of the present invention has the first stop member disposed between the inner rail and the outer rail and extending away from the accommodation space. In other words, the first stop member is disposed at the inner rail outside of the accommodation space. Such configuration allows the accommodation space between the inner rail and the outer rail to be entirely used for accommodating the flexible circuitry. As the first stop member is moved to the inner rail outside of the accommodation space, the flexible circuitry would not be torn or damaged by the first stop member when the outer rail is reciprocating.

For making the above and other purposes, features and benefits become more readily apparent to those ordinarily skilled in the art, the preferred embodiments and the detailed descriptions with accompanying drawings will be put forward in the following descriptions.

BRIEF DESCRIPTION OF THE DRAWINGS

The present invention will become more readily apparent to those ordinarily skilled in the art after reviewing the following detailed description and accompanying drawings, in which.

DETAILED DESCRIPTION OF THE INVENTION

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 1:
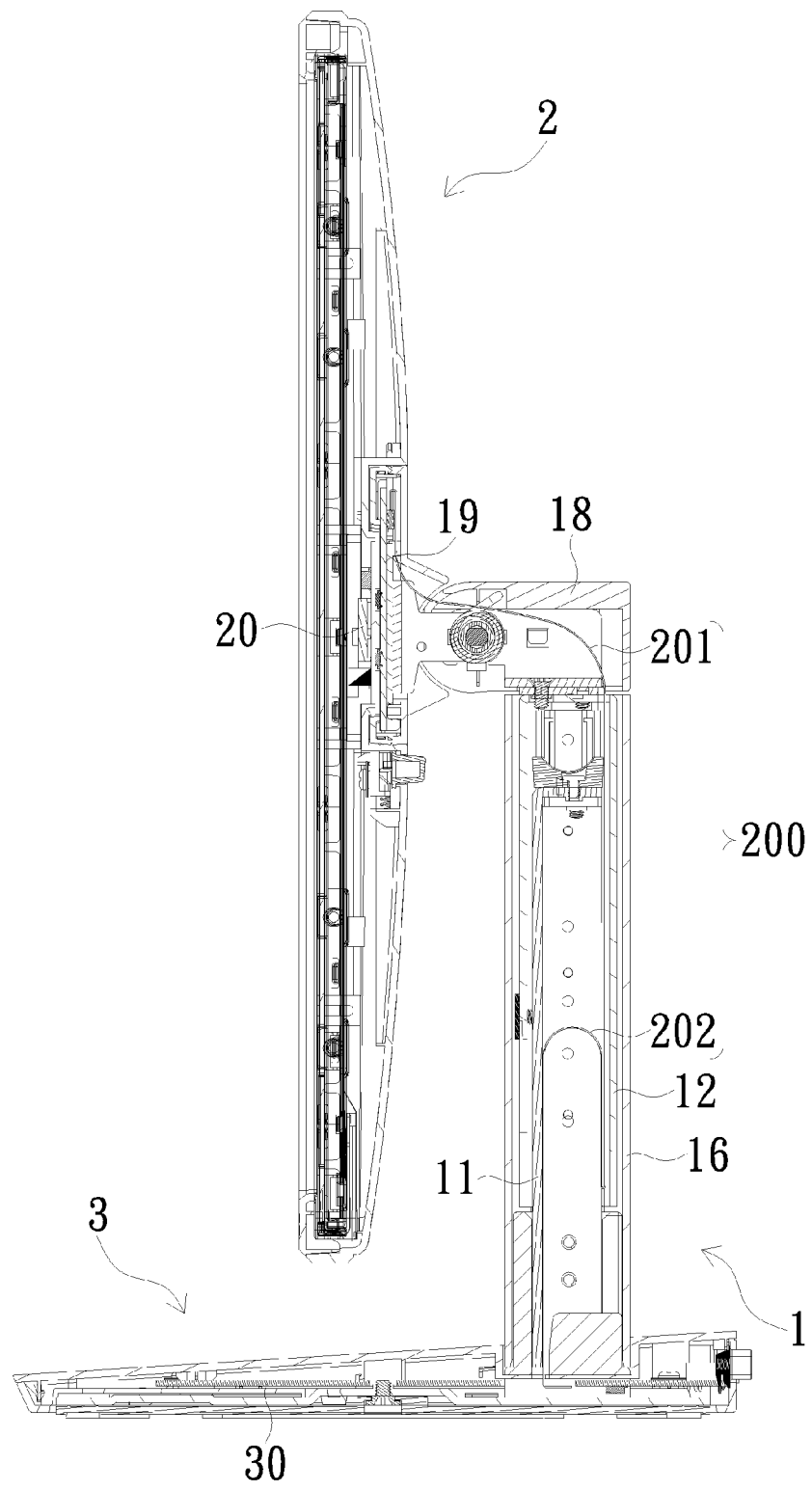
FIG. 1 is a schematic cross-sectional view of a display device according to an embodiment of the present invention.
Figure 2:
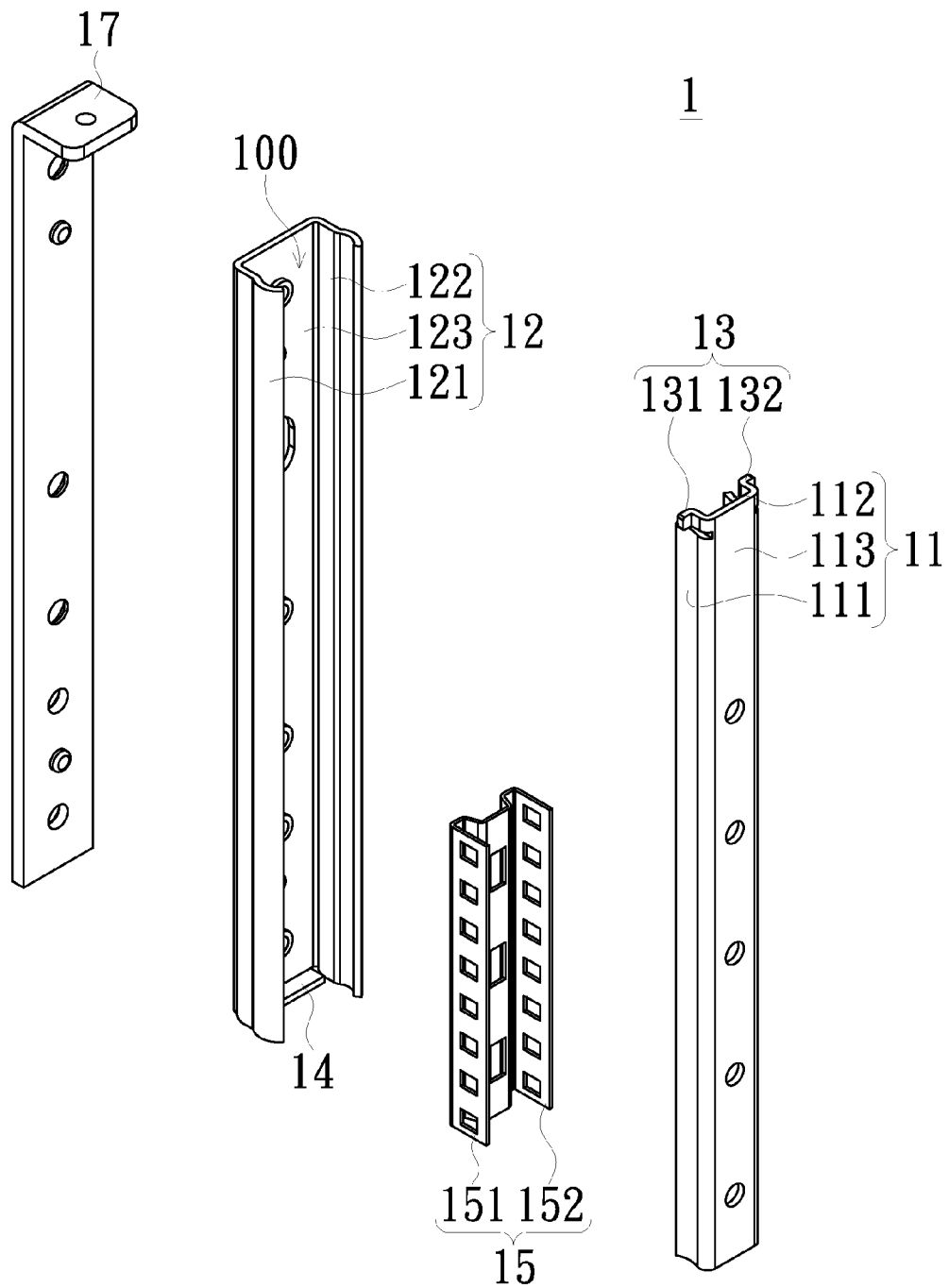
FIG. 2 is a schematic exploded view of a support frame assembly according to the embodiment of the present invention.
Figure 3:
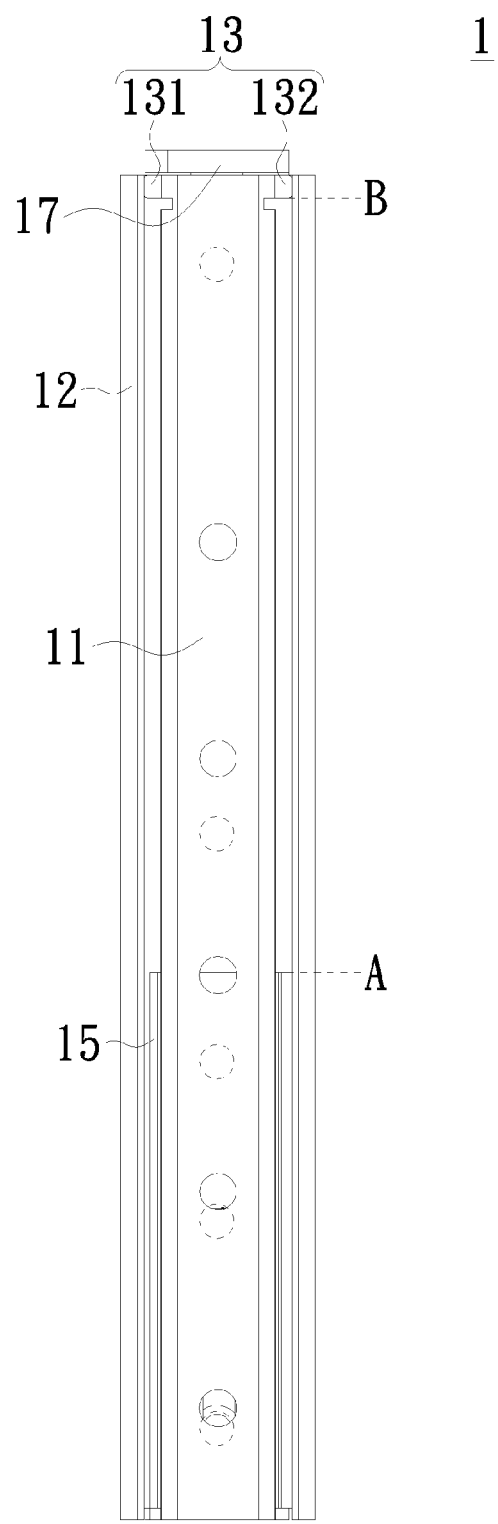
FIG. 3 is a schematic side view of the support frame assembly of FIG. 2.
Figure 4:
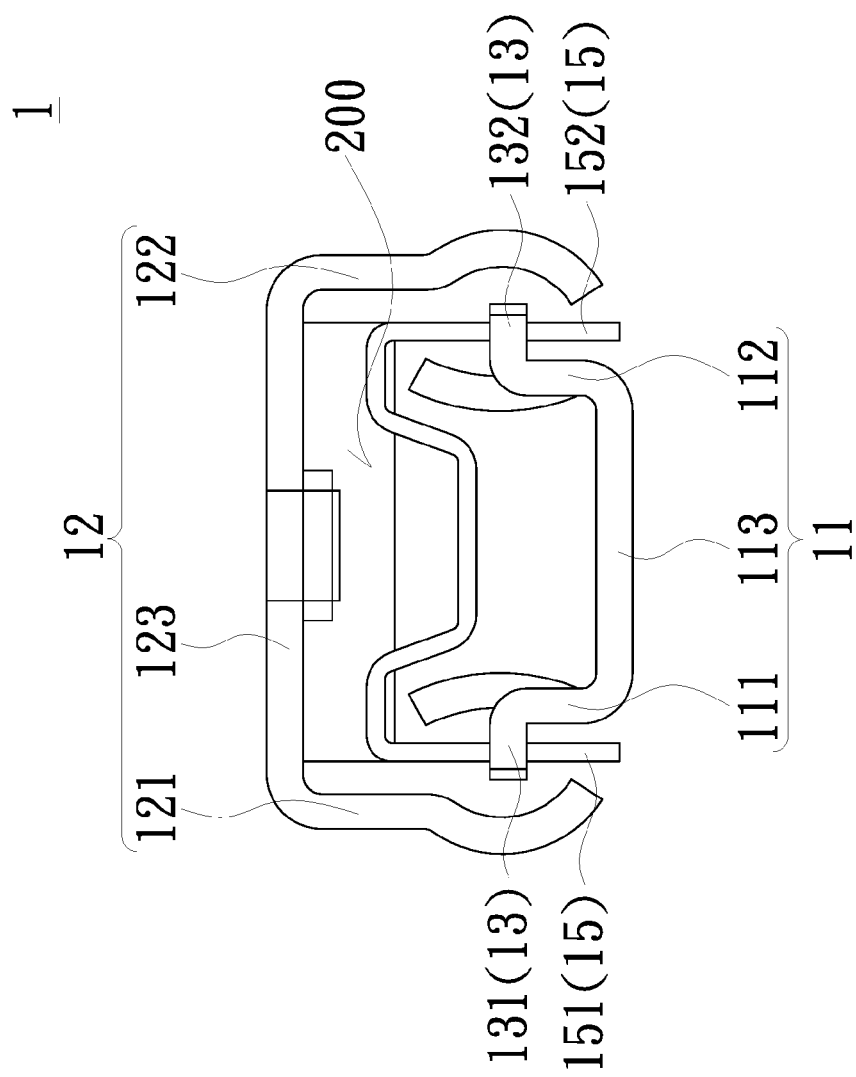
FIG. 4 is a schematic top view of the support frame assembly of FIG. 3.

Referring now to FIG. 1 through FIG. 5. As shown in FIG. 1, the display device of the present embodiment includes a support frame assembly 1, a display 2, and a base 3. The support frame assembly 1 is disposed between the display 2 and the base 3. More specifically, a flexible circuitry 200, including but not limited to flexible flat cable (FFC), flexible print circuit (FPC), is disposed within the support frame assembly 1 and connects the display 2 to the base 3. As illustrated in FIGS. 2-4, the support frame assembly 1 of the present embodiment includes an inner rail 11, an outer rail 12, and a first stop member 13. The inner rail 11 is connected to the base 3. The outer rail 12 is connected to the display 2, and is movably connected to the inner rail 11 so that the outer rail 12 may move back and forth along the inner rail 11. An accommodation space 100 is formed between the outer rail 12 and the inner rail 11 for accommodating the flexible circuitry 200. The first stop member 13 is disposed between the inner rail 11 and the outer rail 12 and extends from the inner rail 11 toward a direction away from the accommodation space 200 for restricting the outer rail 12 to move along the inner rail 11 within a defined range (that is, between position A and position B in FIG. 3).

A detailed description of the assembly of the support frame assembly 1 of the present embodiment is provided as follows.

Figure 5:
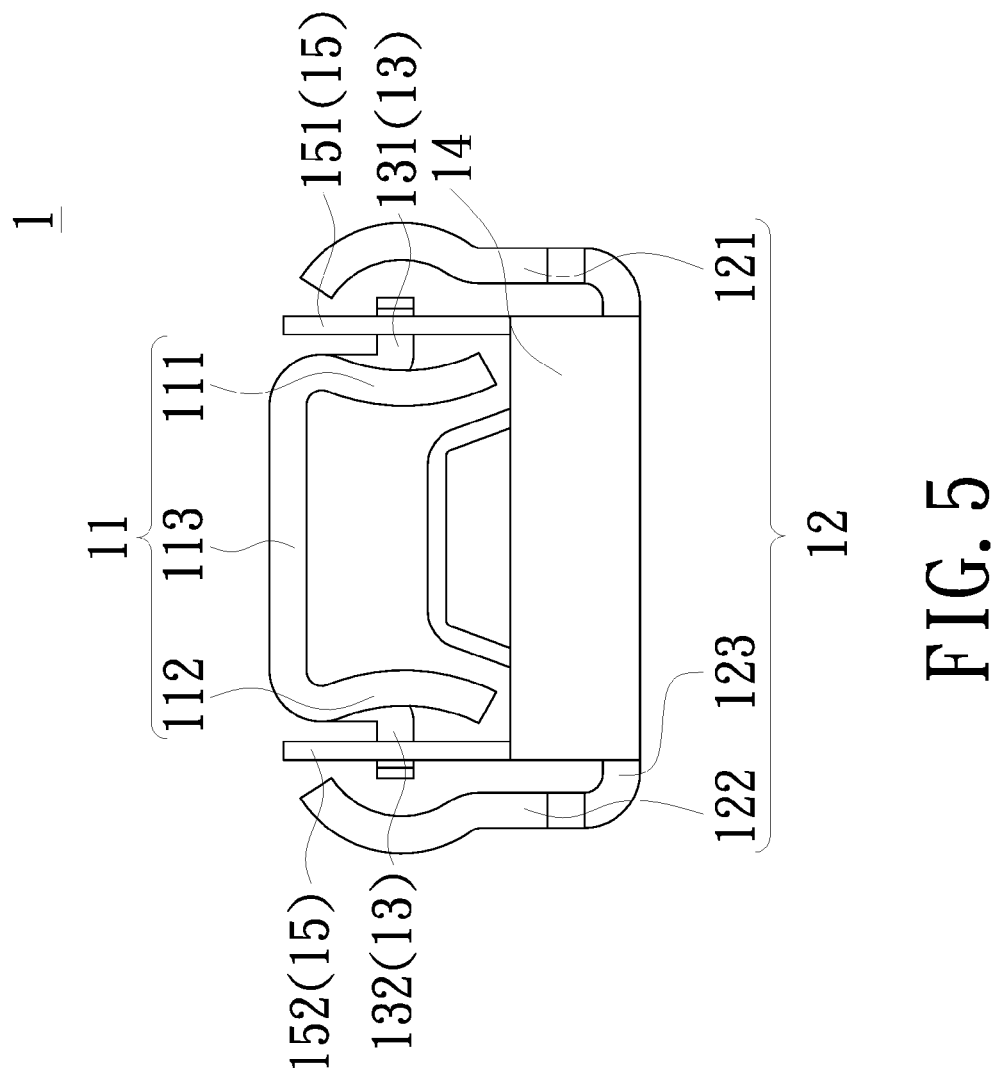
FIG. 5 is a s schematic bottom view of the support frame assembly of FIG. 3.

As illustrated in FIGS. 2, 4 and 5, the inner rail 11 of the support frame assembly 1 includes a first sidewall 111, a second sidewall 112 opposite to the first sidewall 111, and a first wall 113 disposed between the first sidewall 111 and the second sidewall 112. The outer rail 12 includes a third sidewall 121, a fourth sidewall 122 opposite to the third sidewall 121, and a second wall 123 disposed between the third sidewall 121 and the fourth sidewall 122. The first sidewall 111 of the inner rail 11 is opposite to the third sidewall 121 of the outer rail 12. The second sidewall 112 of the inner rail 11 is opposite to the fourth sidewall 122 of the outer rail 12. The first wall 113 of the inner rail 11 is opposite to the second wall 123 of the outer rail 12. Furthermore, in the present embodiment, the accommodation space 100 for accommodating the flexible circuitry 200 is formed by the first sidewall 111, the second sidewall 112, the first wall 113, and the second wall 123 of the outer rail 12. It is to be noted that connection member 17 is omitted in FIGS. 3-5 to make the structural configuration of the support frame assembly 1 more comprehensible. The connection member 17 will be described in detail later in this specification.

As illustrated in FIGS. 2 and 4, the first stop member 13 of the support frame assembly 1 of the present embodiment includes a first protrusion 131 and a second protrusion 132. The first protrusion 131 extends from the first sidewall 111 of the inner rail 11 toward the third sidewall 121 of the outer rail 12, and the second protrusion 132 extends from the second sidewall 112 of the inner rail 11 toward the fourth sidewall 122 of the outer rail 12; however, the present invention is not limited thereto. The positions of the first protrusion 131 and the second protrusion 132 (that is, the movable range of the outer rail 12 along the inner rail 11) may vary according to specific needs as long as the first protrusion 131 is disposed between the first sidewall 111 and the third sidewall 121 and the second protrusion 132 is disposed between the second sidewall 112 and the fourth sidewall 122. For example, the first protrusion 131 may be disposed between the upper end and the lower end of the first sidewall 111, and the second protrusion 132 may be disposed between the upper end and lower end of the second sidewall 112.

As illustrated in FIGS. 2, 4 and 5, the support frame assembly 1 of the present embodiment may further include a second stop member 14 and a slide assembly 15. The second stop member 14 is disposed between the third sidewall 121 and the fourth sidewall 122 of the outer rail 12, and extends from the bottom of the second wall 123 of the outer rail 12 toward the inner rail 11. The slide assembly 15 is disposed at the outer rail 12 and between the first stop member 13 and the second stop member 14. The slide assembly 15 includes a first slide member 151 and a second slide member 152. The first slide member 151 is disposed between the first sidewall 111 of the inner rail 11 and the third sidewall 121 of the outer rail 12, and the second slide member 152 is disposed between the second sidewall 112 of the inner rail 11 and the fourth sidewall 122 of the outer rail 12. More specifically, the slide assembly 15 is disposed at the lower end of the outer rail 12 and contacts the second stop member 14, which is configured for providing support to the slide assembly 15 and avoiding separation of the slide assembly 15 from the outer rail 12. Furthermore, at least one ball (not shown in figures) in contact with the inner rail 11 may be disposed at the first slide member 151 and/or the second slide member 152 of the slide assembly 15 so that the outer rail 12 may slide along the inner rail 11 via the slide assembly 15. It is to be understood that the present invention is not limited to disposing the slide assembly 15 at the lower end of the outer rail 12. The slide assembly 15 may be disposed at any position on the outer rail 12 according to specific needs as long as the slide assembly 15 is between the first stop member 13 and the second stop member 14.

Figure 6:
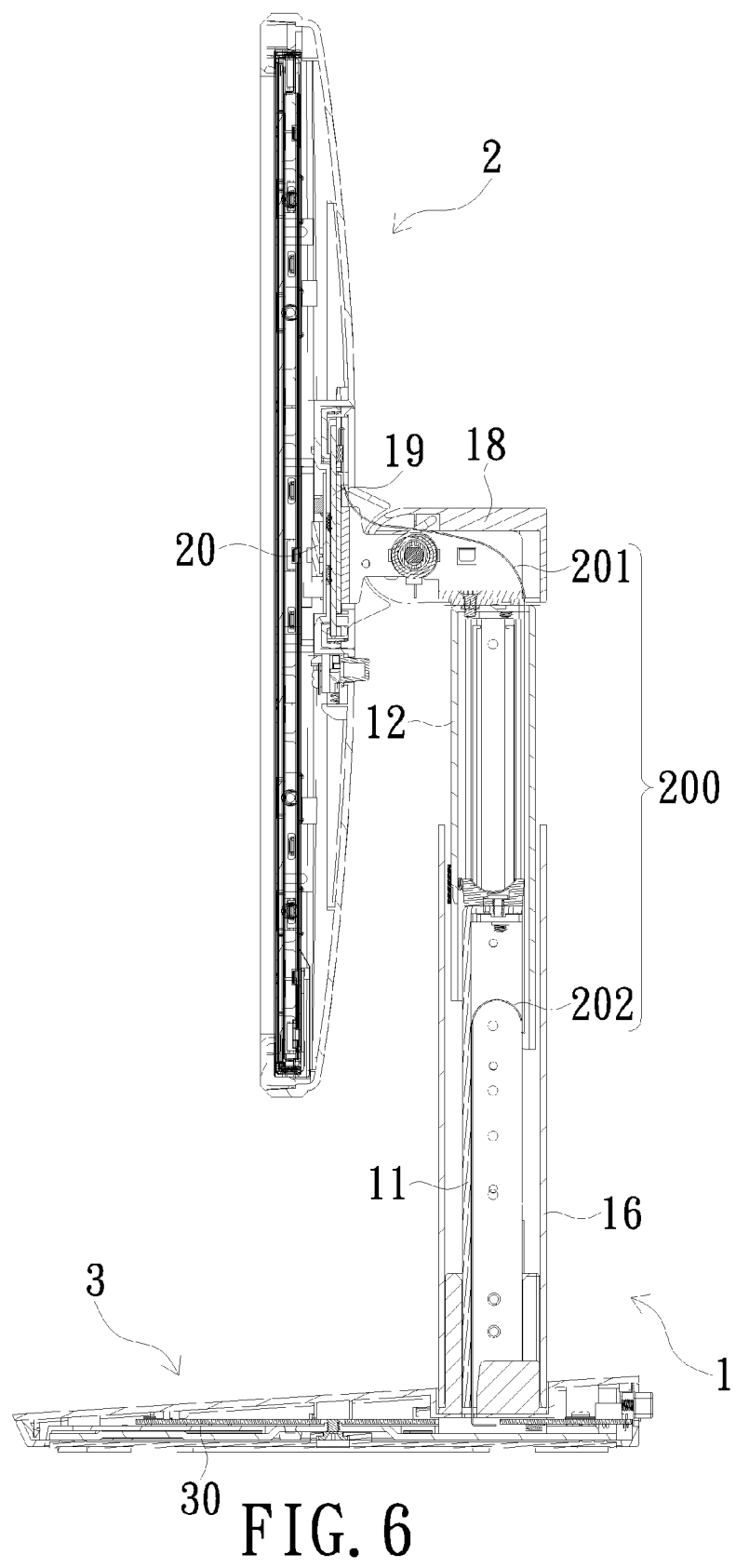
FIG. 6 is a schematic cross-sectional view of the display device of FIG. 1 when the support frame assembly is extended.

As illustrated in FIGS. 3 and 5, the upper end of the slide assembly 15 is at position A relative to the inner rail 11 when the support frame assembly 1 is completely folded (as shown in FIG. 1); whereas, the support frame assembly 1 is extended (as shown in FIG. 6) when the slide assembly 15 on the outer rail 12 slides along the inner rail 11 to position B and abuts against the first stop member 13 on the inner rail 11 (that is, the upper ends of the first slide member 151 and the second slide member 152 of the slide assembly 15 are abutted against the lower ends of the first protrusion 131 and the second protrusion 132 of the first stop member 13). In other words, the distance between positions A and B is the maximum deployable range of the support frame assembly 1 of the present embodiment, and the distance between the upper end of the slide assembly 15 and the lower end of the first stop member 13 is the maximum reciprocating range of the support frame assembly 1.

Referring now to FIG. 6. Together with FIG. 1, FIG. 6 illustrates that the flexible circuitry 200 includes a first portion 201 and a second portion 202. The first portion 201 is partially attached to the second wall 123 of the outer rail 12, and the second portion 202 is flexible. As such, the second portion 202 of the flexible circuitry 200 would be stretched when the slide assembly 15 on the outer rail 12 is sliding upwards along the inner rail 11, and flexibility of the second portion 200 would prevent direct tearing and breakage of the flexible circuitry 200.

As illustrated in FIG. 1 through FIG. 6, the support frame assembly 1 of the present embodiment may further include a housing 16 disposed at the base 3. The inner rail 11 and the outer rail 12 are covered within the housing 16 when the support frame assembly 1 is completely folded, whereas the outer rail 12 is exposed out of the housing 16 when the outer rail 12 slides upwards along the inner rail 11 via the slide assembly 15. The inner rail 11 and the housing 16 may be, but are not limited to, detachably connected to the base 3.

As illustrated in FIGS. 1, 2 and 6, the display 2 includes a first connecting circuit board 20, and the base 3 includes a control circuit board 30. A portion of the flexible circuitry 200 is exposed out of the accommodation space 100 of the support frame assembly 1 and electrically connected to the first connecting circuit board 20 of the display 2 and the control circuit board 30 of the base 3. In the present embodiment, the flexible circuitry 200 is detachably connected to the first connecting circuit board 20 of the display 2 and the control circuit board 30 of the base 3. More specifically, the support frame assembly 1 may further include a connection member 17 and a pivot assembly 18. The connection member 17 connects the outer rail 12 to the pivot assembly 18, and is detachably connected to the display 2; thus, a part of the first portion 201 of the flexible circuitry 200 exposing out of the accommodation space 100 is detachably and electrically connected to the first connecting circuit board 20 of the display 2 via the pivot assembly 18. For example, the first portion 201 of the flexible circuitry 200 may electrically connect to a second connecting circuit board 19 at the pivot assembly 18. The second connecting circuit board 19 includes a second signal connection spot (not shown in figures), and the first connecting circuit board 20 correspondingly includes a first signal connection spot (not shown in figures). When the pivot assembly 18 is detachably connected to the display 2, the second signal connection spot (not shown in figures) on the second connecting circuit board 19 at the pivot assembly 18 is in contact with the first signal connection spot on the first connecting circuit board 20 at the display 2, and the electrical connection between the flexible circuitry 200 and the display 2 is established. Meanwhile, the second portion 202 of the flexible circuitry 200 may detachably and electrically connect to the control circuit board 30 at the base 3 via a connector.

It is to be understood that the present invention is not limit to detachably connecting the support frame assembly 1 to the display 2 via the pivot assembly 18. In other embodiments of the present invention, the support frame assembly 1 may be directly and detachably connected to the display 2; that is, the outer rail 11 of the support frame assembly 1 may be detachably connected to the display 2, and the first portion 201 of the flexible circuitry 200 may be detachably and electrically connected to the connecting circuit board 20 of the display 2 via a connector. Additionally, the present invention does not limit the means of connection of the support frame assembly 1 to the display and the base 3. Besides detachable connections, the support frame assembly 1 may also be directly secured onto the display 2 and the base 3.

In sum, the support frame assembly of the display device of the present invention has the first stop member disposed between the inner rail and the outer rail and extending away from the accommodation space. In other words, the first stop member is disposed at the inner rail outside of the accommodation space. Such configuration allows the accommodation space between the inner rail and the outer rail to be entirely used for accommodating the flexible circuitry. As the first stop member is moved to the inner rail outside of the accommodation space, the flexible circuitry would not be torn or damaged by the first stop member when the outer rail is reciprocating.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A display device, comprising:
 a display;
 a base, connected to the display via a flexible circuitry; and
 a support frame assembly, disposed between the display and the base, the support frame assembly comprising:
  an inner rail, connected to the base, the inner rail comprises a first sidewall, a second sidewall opposite to the first sidewall, and a first wall disposed between the first sidewall and the second sidewall;
  an outer rail, connected to the display, wherein the outer rail is movably connected to the inner rail so that the outer rail is disposed at a first position or a second position relative to the base, and an accommodation space is formed between the outer rail and the inner rail for accommodating the flexible circuitry, the outer rail comprises a third sidewall, a fourth sidewall opposite to the third sidewall, and a second wall disposed between the third sidewall and the fourth sidewall, the first sidewall is opposite to the third sidewall, the second sidewall is opposite to the fourth sidewall, the first wall is opposite to the second wall, and the accommodation space is formed by the first sidewall, the second sidewall, the first wall and the second wall; and
  a first stop member, disposed between the inner rail and the outer rail and extending from the inner rail toward a direction away from the accommodation space for restricting the outer rail to move along the inner rail between the first position and the second position, wherein the first stop member comprises a first protrusion extending from the first sidewall toward the third sidewall and a second protrusion extending from the second sidewall toward the fourth sidewall.

2. The display device according to claim 1, wherein the support frame assembly further comprises a second stop member, disposed between the third sidewall and the fourth sidewall and extending from a bottom of the second wall toward the first wall.

3. The display device according to claim 2, wherein the support frame assembly further comprises a slide assembly, disposed at the outer rail and between the first stop member and the second stop member, for enabling the outer rail to move along the inner rail, the slide assembly comprises a first slide member and a second slide member, the first slide member is disposed between the first sidewall and the third sidewall, and the second slide member is disposed between the second sidewall and the fourth sidewall.

4. The display device according to claim 3, wherein the slide assembly abuts against the first stop member when the outer rail is disposed at the second position.

5. The display device according to claim 1, wherein the flexible circuitry comprises a first portion and a second portion, the first portion is partially attached to the second wall of the outer rail, and the second portion is flexible.

6. The display device according to claim 1, wherein the flexible circuitry partially exposes out of the accommodation space and connects to the base and the display.

7. The display device according to claim 1, wherein the inner rail is detachably connected to the base.

8. The display device according to claim 1, wherein the outer rail is detachably connected to the display.

9. The display device according to claim 1, wherein the support frame assembly further comprises a housing, covering the inner rail and the outer rail and disposed at the base, and at least a portion of the outer rail is exposed out of the housing when the outer rail is disposed at a position higher than the first position.

10. The display device according to claim 1, wherein the display comprises a connecting circuit board, the base comprises a control circuit board, and the flexible circuitry is detachably and electrically connected to the connecting circuit board and the control circuit board.

\* \* \* \* \*